United States Patent
Tsao et al.

(10) Patent No.: US 8,633,439 B2
(45) Date of Patent: Jan. 21, 2014

(54) SYSTEM AND METHOD FOR ELECTROMAGNETIC INTERFERENCE SHIELDING FOR CRITICAL DIMENSION-SCANNING ELECTRON MICROSCOPE

(75) Inventors: Chia-Chi Tsao, Zhubei (TW); Syun-Jie Jhan, Hsinchu (TW); Yi-Cheng Shih, Zhubei (TW); Chwen Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 389 days.

(21) Appl. No.: 13/175,384

(22) Filed: Jul. 1, 2011

(65) Prior Publication Data
US 2013/0001419 A1   Jan. 3, 2013

(51) Int. Cl.
*G01N 23/00* (2006.01)
*G21K 7/00* (2006.01)

(52) U.S. Cl.
USPC ........... 250/311; 250/306; 250/307; 250/310; 250/396 ML; 250/442.11; 250/443.1; 250/441.11

(58) Field of Classification Search
USPC ................ 250/306, 307, 310, 311, 442.11, 250/396 ML, 443.1, 441.11
See application file for complete search history.

(56) References Cited

U.S. PATENT DOCUMENTS 3,694,652 A * 9/1972 Banbury et al. ............... 250/310
4,400,609 A * 8/1983 Pastushenko et al. ... 219/121.29
4,405,861 A * 9/1983 Giacchetti et al. ............ 250/305

* cited by examiner

*Primary Examiner* — Jack Berman
*Assistant Examiner* — Meenakshi Sahu
(74) *Attorney, Agent, or Firm* — Haynes and Boone, LLP

(57) ABSTRACT

System and method for EMI shielding for a CD-SEM are described. One embodiment is a scanning electron microscope ("SEM") comprising an electron gun for producing an electron beam directed toward a sample; a secondary electron ("SE") detector for detecting secondary electrons reflected from the sample in response to the electron beam; and a dual-layer shield disposed around and enclosing the SE detector. The shield comprises a magnetic shielding lamina layer and a metallic foil layer.

20 Claims, 3 Drawing Sheets

SYSTEM AND METHOD FOR ELECTROMAGNETIC INTERFERENCE SHIELDING FOR CRITICAL DIMENSION-SCANNING ELECTRON MICROSCOPE

BACKGROUND

During fabrication of integrated circuit ("IC") masks, for example, critical dimension ("CD") controls are implemented in stages to ensure dimensions such as spacing and line width are maintained within predefined specifications. Currently, to identify CD errors, CD measurements are generally obtained using equipment such as a critical dimension scanning electron microscope ("CD-SEM"). CD-SEM uses a scanning electron microscope to take top-down images of pattern features and extract dimension information from those images.

The fabrication environment in which CD-SEM equipment is used is replete with sources of electro-magnetic interference ("EMI"), the effects of which negatively impact the CD-SEM, resulting in blurred images and fluctuation of the measurement spot. Clearly, this has a negative impact on quality control ("QC"). Currently available CD-SEMs provide some level of EMI shielding. For example, at least one commercially-available CD-SEM has a cover made of iron ("Fe") having a thickness of 1 mm; this provides EMI shielding of approximately 3 milligauss (mG). Such a cover, however, it is generally ineffective against the wide range of EMI (e.g., high- and low-frequency) originating from various sources within a fab at levels of 10-15 mG.

In view of the foregoing, what is needed is an improved method and system for shielding CD-SEM equipment from EMI within a fab.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
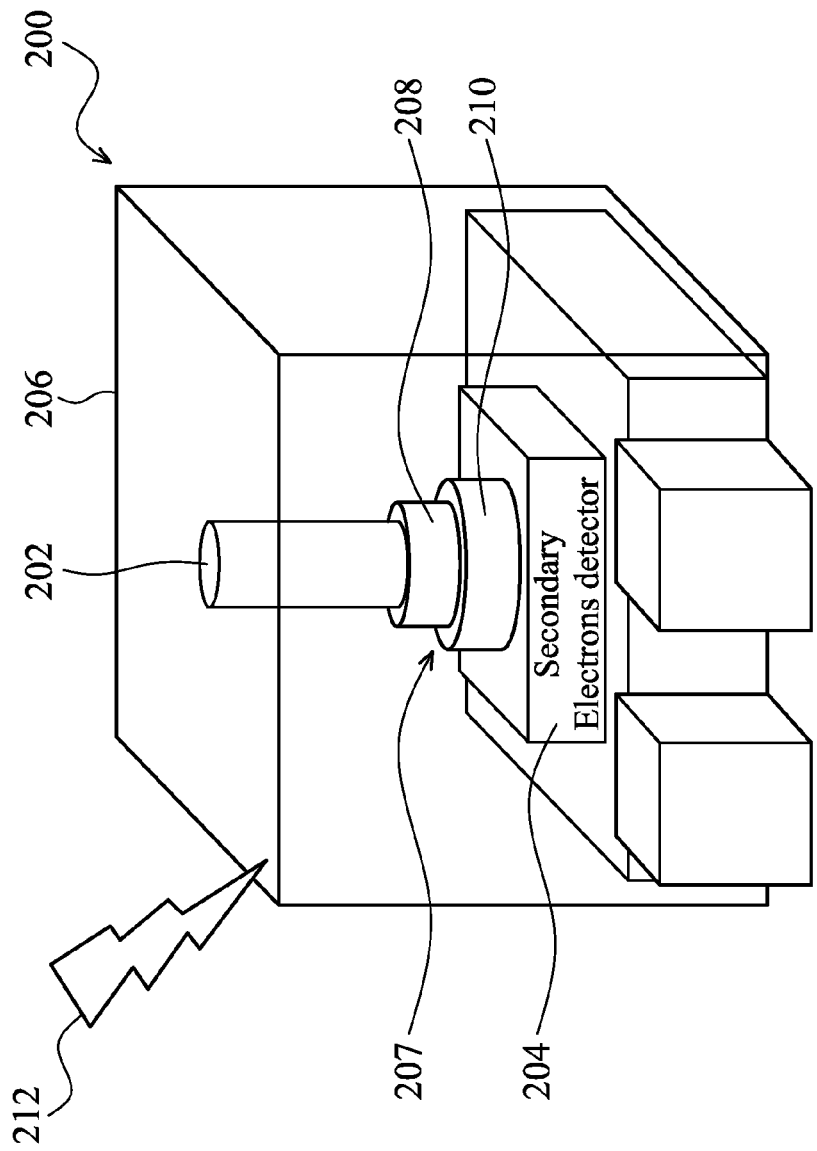
FIG. 1 illustrates a block diagram of a CD-SEM in accordance with embodiments described herein.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring now to FIG. 1, a CD-SEM 100 in accordance with embodiments described herein is illustrated. As shown in FIG. 1, the CD-SEM 100 comprises an electron gun 102 and an SE detector 104. As will be recognized by one of ordinary skill in the art, in operation, an electron beam is thermionically emitted from the electron gun 102. The beam is focused by a series of lenses (not shown in FIG. 1) and is deflected in the x and y axes so that it scans in a raster fashion over a rectangular area of the sample surface. When the electron beam interacts with the sample, such as the mask, the energy exchange between the beam and the sample results in the reflection of secondary electrons by inelastic scattering, which is detected by the SE detector 104. The CD-SEM 100 further includes a cover 106, the front side and top of which in the illustrated embodiment have been cut away so that the inside of the CD-SEM 100 is visible. In one embodiment, the cover 106 is fabricated of iron and has a thickness of approximately 1 mm. The cover 106 is capable of shielding the electron gun 102 and more importantly, the SE detector 104 from EMI 108 of less than or approximately equal to 3 mG. Unfortunately, as previously mentioned, when used in a semiconductor fab environment, a CD-SEM may be subjected to EMI of well over 10 mG. As a result, the cover 106 does not provide sufficient environmental EMI shielding.

In accordance with features of one embodiment, a dual-layer shield 107, comprising a shielding elements 108 disposed within a shielding element 110, is provided around the base of the gun 102 and, more importantly, around the SE detector 104 such that it completely surrounds the SE detector. In one embodiment, the shielding element 108 comprises magnetic shielding lamina comprised of a nickel-iron (Ni—Fe) alloy, while the shielding element 110 comprises a shielding foil comprised of aluminum ("Al"). The Ni—Fe magnetic shielding lamina is effective due to its high permeability $\mu$ (i.e., approximately $2.4 \times 10^{-2}$ henry/meter (H/m)) and relative permeability $\mu/\mu_0$ (i.e., approximately 8000). Other highly ferro-magnetic materials with high permeabilities/relative permeabilities, including, but not limited to steel plate and platinum, may be substituted for Ni—Fe. The Al shielding foil is effective due to its high conductivity $\sigma$ (i.e., approximately $3.5 \times 10^7$ siemens/meter (S/m) at 20° C.) and low resistivity $\rho$ (i.e., approximately $2.82 \times 10^{-8}$ ohm meters ($\Omega$m) at 20° C.), relatively low cost compared to other materials with similar properties, and resistance to corrosion. Other effective conductors that are similarly corrosion-resistant may be substituted for Al, including, but not limited to, gold, copper, and silver.

As will be described in greater detail below, due to the combination of materials described above, and more particularly due to the high conductivity and high permeability of the shield due to the combination of materials comprising the shield 107, the shield is highly effective to block EMI 112 resulting from the fab environment from affecting performance of the CD-SEM 100, and particularly the SE detector 104. For example, the shield 107 is capable of blocking EMI of approximately 4 to 15 mG generated by a sub-fab power tray at a frequency of 60 hertz ("Hz") (due to the high permeability of Ni—Fe), as well as EMI of approximately 12 mG generated by an automated material handling system ("AMHS") overhead transport ("OHT") at a frequency of approximately 400-10,000 Hz (due to the high conductivity of Al).

Figure 2:
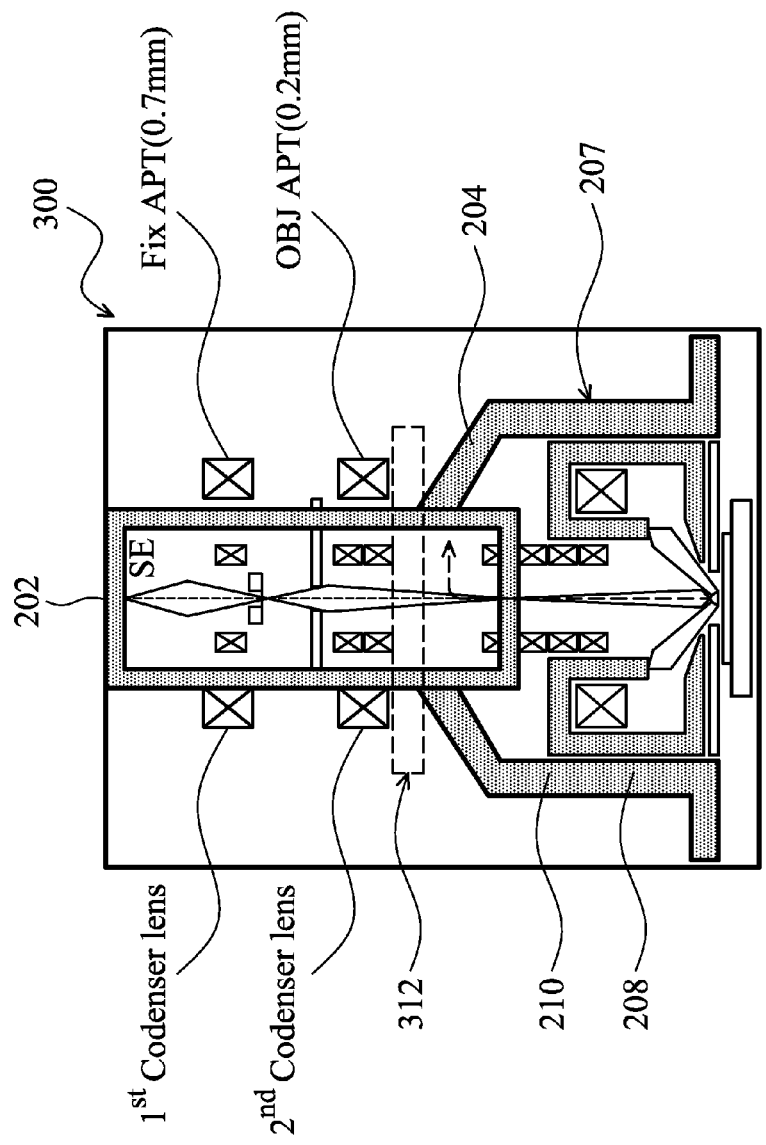
FIG. 2 illustrates an alternative arrangement of a CD-SEM in accordance with embodiments described herein.

FIG. 2 is a cutaway view of an alternative arrangement of a CD-SEM 200 in accordance with one embodiment. As with the CD-SEM 200 shown in FIG. 2, the CD-SEM 200 also comprises an electron gun 202 and an SE detector 204 disposed within a cover 206, each of which may be similar or identical to those elements of the CD-SEM 100. As described above with reference to FIG. 1, the CD-SEM 200 also includes a dual-layer shield 207, comprising a shielding element 208 disposed within a shielding element 210, is provided around the base of the gun 202 and around the SE detector 204 such that it completely surrounds the SE detector.

The CD-SEM 200 differs from the CD-SEM 100 in that it includes an inductor coil 212 through which the electron beam produced by the electron gun 202 passes. The inductor coil 212 partially protects the electron beam from EMI influences. In particular, the inductor coil protects the inspection line of 90 degrees from EMI Y-axis influence; however, the inductor coil is incapable of protecting the inspection line of 0 degree from EMI Y axis influence or the inspection line of 0 and 90 degrees from EMI X axis influence. Only the shield 207 is capable of shielding all four inspection lines from the influence of EMI, due to its combined characteristics of high permeability and high conductivity.

Figure 3:
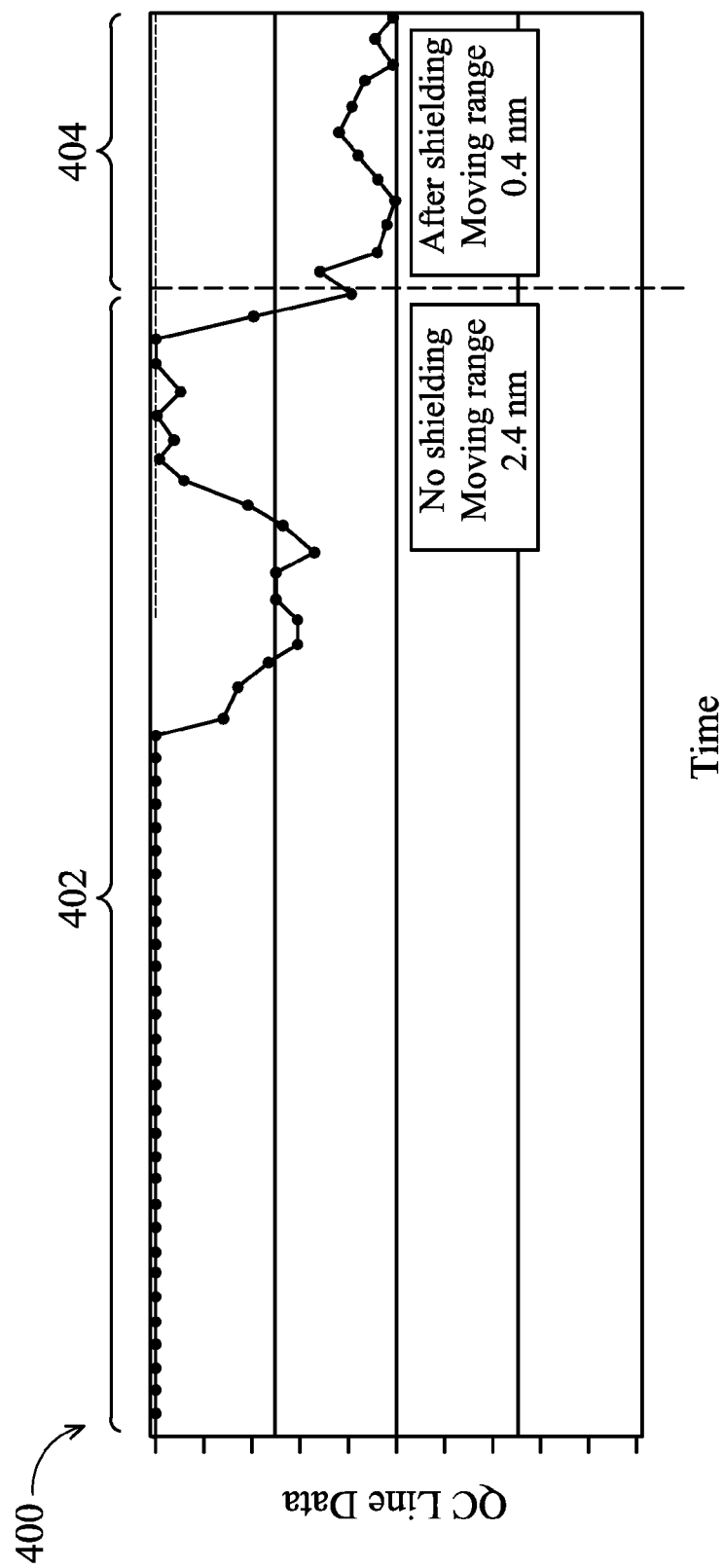
FIG. 3 is a graph illustrating a moving range of quality control line data before and after shielding in accordance with one embodiment.

FIG. 3 is a graph 300 illustrating a moving range of quality control line data before and after shielding in accordance with one embodiment. In particular, a first portion 302 of the data illustrates a moving range prior to shielding and a second portion 304 of the data illustrates a moving range subsequent to shielding. As is evident from the graph 300, the shielding has a significant impact on the moving range. Specifically, prior to shielding, the moving range is approximately 2.4 nm; subsequent to shielding, the moving range is 0.4 nm.

One embodiment is a scanning electron microscope ("SEM") comprising an electron gun for producing an electron beam directed toward a sample; a secondary electron ("SE") detector for detecting secondary electrons reflected from the sample in response to the electron beam; and a dual-layer shield disposed around and enclosing the SE detector. The shield comprises a magnetic shielding lamina layer and a metallic foil layer.

Another embodiment is an apparatus for shielding a secondary electron ("SE") detector of a scanning electron microscope ("SEM") from effects of EMI. The apparatus comprises a dual-layer shield disposed around and enclosing the SE detector, the shield comprising a first layer comprising a magnetic shielding lamina; and a second layer comprising a metallic foil.

Yet another embodiment is a method of shielding a secondary electron ("SE") detector of a scanning electron microscope ("SEM") from effects of electromagnetic interference ("EMI"). The method comprises providing a first shielding layer around the SE detector; and providing a second shielding layer over the first shielding layer.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Moreover, each of the modules depicted in the drawings can be implemented on multiple devices, including computing devices, and implementation of multiple ones of the depicted modules may be combined into a single device, including a computing device. Furthermore, features illustrated and discussed above with respect to some embodiments can be combined with features illustrated and discussed above with respect to other embodiments. Accordingly, all such modifications are intended to be included within the scope of this invention.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A scanning electron microscope ("SEM") comprising:
   an electron gun for producing an electron beam directed toward a sample;
   a secondary electron ("SE") detector for detecting secondary electrons reflected from the sample in response to the electron beam;
   a dual-layer shield disposed around and enclosing the SE detector, the shield comprising:
   a magnetic shielding lamina layer; and
   a metallic foil layer.

2. The SEM of claim 1 wherein the magnetic shielding lamina layer comprises a highly ferro-magnetic material.

3. The SEM of claim 1 wherein the metallic foil layer comprises a highly reflective conductor.

4. The SEM of claim 1 wherein the magnetic shielding lamina layer comprises a nickel-iron alloy.

5. The SEM of claim 1 wherein the magnetic shielding lamina layer comprises one of steel plate and platinum.

6. The SEM of claim 1 wherein the metallic foil layer comprises aluminum foil.

7. The SEM of claim 1 wherein the metallic foil comprises at least one of gold foil, copper foil, and silver foil.

8. The SEM of claim 1 wherein the shield comprises the first layer disposed over the second layer.

9. The SEM of claim 1 wherein the shield comprises the second layer disposed over the first layer.

10. An apparatus for shielding a secondary electron ("SE") detector of a scanning electron microscope ("SEM") from effects of electromagnetic interference ("EMI"), the apparatus comprising:
    a dual-layer shield disposed around and enclosing the SE detector, the shield comprising:
    a first layer comprising a magnetic shielding lamina; and
    a second layer comprising a metallic foil.

11. The apparatus of claim 10 wherein the magnetic shielding lamina comprises a nickel-iron alloy.

12. The apparatus of claim 10 wherein the magnetic shielding lamina comprises one of steel plate and platinum.

13. The apparatus of claim 10 wherein the metallic foil comprises aluminum foil.

14. The apparatus of claim 10 wherein the metallic foil layer comprises at least one of gold foil, copper foil, and silver foil.

15. The apparatus of claim 10 wherein the shield comprises the magnetic shielding lamina layer disposed over the metallic foil layer.

16. The apparatus of claim 10 wherein the shield comprises the metallic foil layer disposed over the magnetic shielding lamina layer.

17. A method of shielding a secondary electron ("SE") detector of a scanning electron microscope ("SEM") from effects of electromagnetic interference ("EMI"), the method comprising:
   providing a first shielding layer around the SE detector; and
   providing a second shielding layer over the first shielding layer.

18. The method of claim 17 wherein one of the first and second layers comprises a metallic foil layer and the other one of the first and second layers comprises a magnetic shielding lamina.

19. The method of claim 18 wherein the metallic foil layer comprises one of aluminum, copper, gold, and silver.

20. The method of claim 18 wherein the magnetic shielding lamina comprises one of a nickel-iron alloy, steel plate, and platinum.

* * * * *